United States Patent [19]

Fernandez et al.

[11] Patent Number: 4,987,327
[45] Date of Patent: Jan. 22, 1991

[54] APPARATUS FOR ADJUSTING DC OFFSET VOLTAGE

[75] Inventors: Virgilio A. Fernandez, Sunrise, Fla.; Gianfranco Gerosa, Austin, Tex.

[73] Assignee: Motorola, Inc., Schaumburg, Ill.

[21] Appl. No.: 357,911

[22] Filed: May 30, 1989

[51] Int. Cl.$^5$ ............................ G06G 7/10; H03K 3/01
[52] U.S. Cl. .................................... 307/491; 307/494; 307/296.4; 307/296.5
[58] Field of Search ............ 307/491, 494, 497, 296.5, 307/296.6, 296.1; 330/261, 257, 253, 301, 296

[56] References Cited

U.S. PATENT DOCUMENTS

| | | | |
|---|---|---|---|
| 4,360,785 | 11/1982 | Schade, Jr. | 330/261 |
| 4,658,157 | 4/1987 | McGowan | 330/261 |
| 4,714,845 | 12/1987 | Devecchi et al. | 307/494 |
| 4,717,888 | 1/1988 | Vinn et al. | 330/261 |
| 4,808,848 | 2/1989 | Miller | 307/494 |

OTHER PUBLICATIONS

Article by L. Richard Carley, titled "Trimming Analog Circuits Using Floating-Gate Analog MOS Memory", 1989 IEEE International Solid-State Circuits Conference, Feb. 16, 1989.

Primary Examiner—Stanley D. Miller
Assistant Examiner—Richard Roseen
Attorney, Agent, or Firm—Robert S. Babayi

[57] ABSTRACT

A CMOS differential amplifier or comparator circuit (100) is provided having minimized DC offset voltage. The circuit includes parallel coupled stages (110, 120, 130, 140, 150, 160) that are selectively controlled by an F.E.T. switch (182). The current through each stage is a function of its FET sizing. The current through the differential amplifier is adjusted by the selectively activated certain stages, which increase the current through differential amplifier (100), thereby adjusting the DC offset. The FETs in each stage are sized differently to allow flexibility in adjusting DC offset voltage.

11 Claims, 2 Drawing Sheets

APPARATUS FOR ADJUSTING DC OFFSET VOLTAGE

TECHNICAL FIELD

This invention relates generally to the field of integrated circuits. In particular the present invention relates to CMOS differential pair circuits.

BACKGROUND ART

Differential amplifier circuits, such as comparators and operational amplifiers, are widely used in analog and digital circuits. Differential amplifiers provide a more stable gain, and may generally be fabricated using Integrated Circuit (IC) technologies, such as CMOS. Applying Integrated Circuit technologies significantly reduces the space (area) requirement for a circuit, as well as providing for ease of manufacturing devices using the integrated circuit.

An important consideration in integrating differential amplifier circuits, or any circuit that provides mirrored current, is that the transistors of the circuit must be as identical (or matched) as possible. Otherwise, a DC offset may develop at the output of the circuit. Accordingly, in a differential amplifier, mismatch of the input differential pair transistors causes a mismatch in the mirrored currents through the transistors. For example, in a analog to digital converter (ADC) circuit having a resolution of 5 mv, a DC offset of 50 mv at the output of the differential amplifier will cause an erroneous digital result at the output of the ADC circuit.

In CMOS differential amplifier ICs, the DC offset is a function of geometry, and other process dependent mismatches. In order to minimize the effects of the mismatch, layout techniques such as common centroid layout and interdigitization are typically used. However these layout techniques only minimize the DC offset, and once amplifier integration is complete, the resulting DC offset remains and must be dealt with.

Accordingly, a need exists to further minimize or eliminate the DC offset of integrated circuits.

SUMMARY OF THE INVENTION

Accordingly, it is an object of the present invention to reduce the offset voltage of differential transistors, and to avoid the difficulties of the prior art.

Briefly, according to the invention, an apparatus for adjusting the offset voltage of a circuit is provided having a biasing means, and a plurality of stages coupled in parallel. Each stage includes a switch activated by a control signal, which increases the current flowing through the stage. Each stage can be selectively activated when its switch is activated, and the collective number of activated stages adjusts the current through the circuit, thereby adjusting the DC offset voltage.

DETAILED DESCRIPTION OF THE PREFERRED EMBODIMENT

Figure 1:
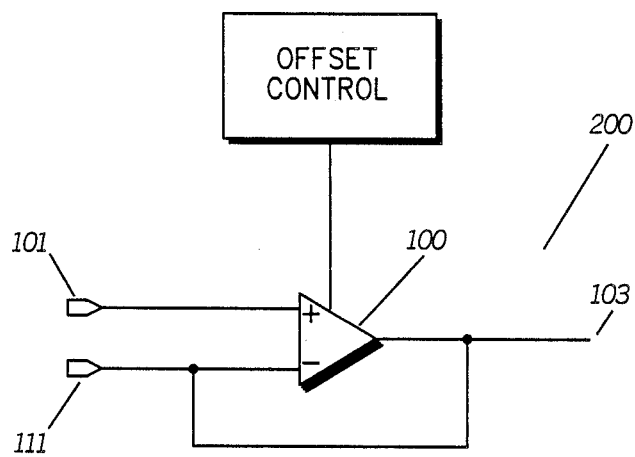
FIG. 1 is block diagram of a voltage follower, which incorporates the circuitry of the present invention.

Referring to FIG. 1, a voltage follower 200 is shown. The voltage follower 200 includes a differential amplifier 100 having its output terminal 103 coupled to an inverting input terminal 111. In this configuration, the output terminal 103 provides a voltage substantially equal to the voltage applied to a non-inverting input terminal 101. In order to determine the DC offset of the differential amplifier 100, a DC voltage is applied at the input terminal 101. The difference between the output DC voltage at terminal 103 and the DC voltage at terminal 101 is the DC offset of the differential amplifier. If no voltage is applied at the input terminal 101, DC voltage at the output terminal 103 comprises the offset voltage.

Figure 2:
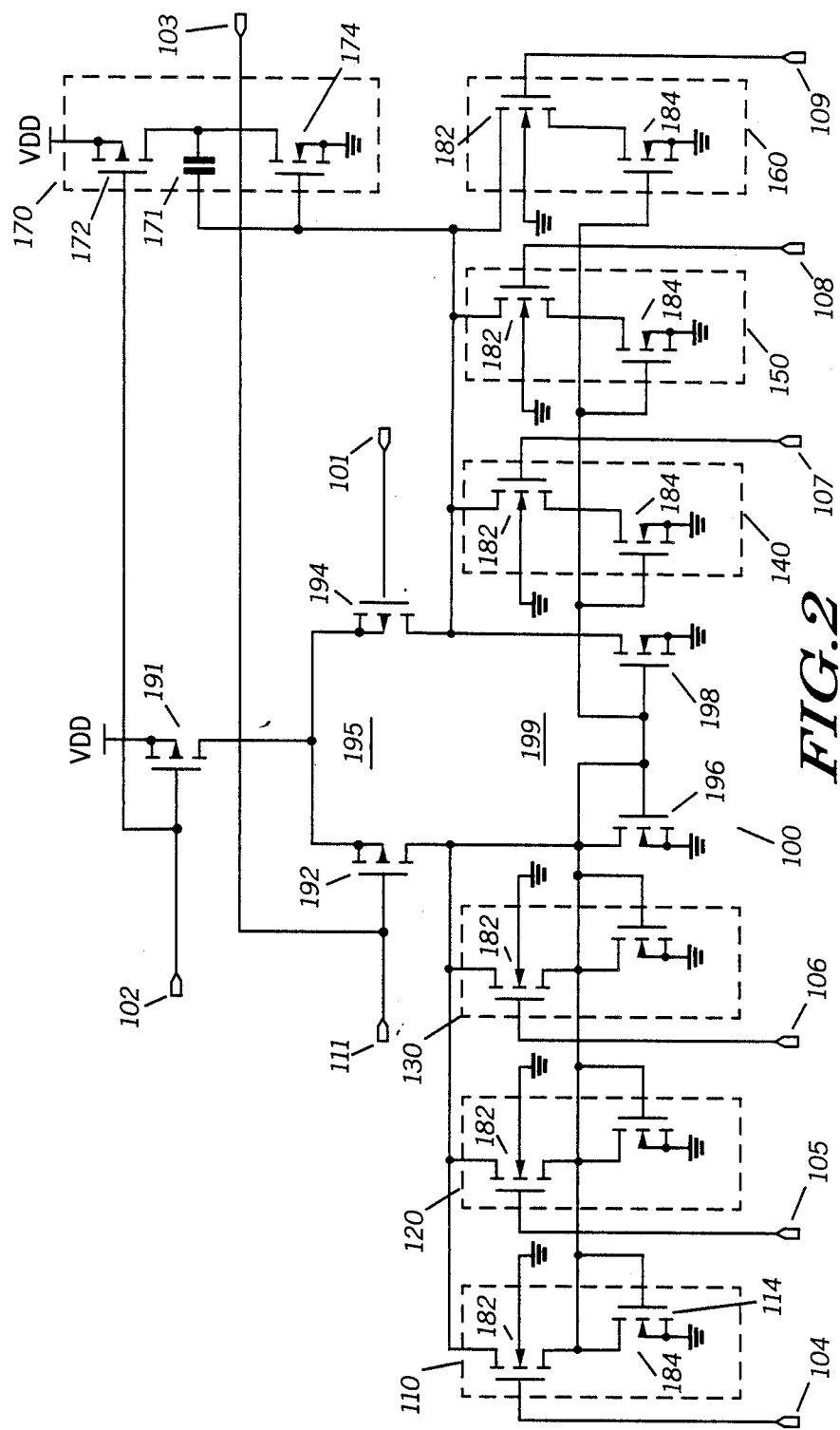
FIG. 2 is schematic diagram of the voltage follower of FIG. 1.

Referring to FIG. 2 a schematic diagram of the differential amplifier 100 of FIG. 1 is shown. In the preferred embodiment of the invention the differential amplifier 100 is integrated using CMOS technology, although other technologies may be used. Preferably, the differential amplifier 100 comprises enhancement mode Field Effect Transistor (FET). A bias supply, VDD, and a P-channel, FET 191 provide the bias for the differential amplifier 100. A terminal 102 controls the bias transistor 191 as is known in the art. A non-inverting transistor 194 and an inverting transistor 192 form a differential pair 195. Transistors 196 and 198 comprise a constant current source 199 for the differential amplifier 100. The gate and the drain of the transistor 196 are coupled to each other, in order to provide mirrored current through transistors 192 and 194. A person of ordinary skill in the art will appreciate that by uncoupling the gate and drain of the transistor 196, and coupling the gate and the drain of transistor 198 to each other a mirrored current through the transistors 192 and 194 may be provided. The later configuration will in effect reverse the order of the inverting and non-inverting inputs.

The differential pair transistors 192 and 194, preferably comprise P-channel FETs, and the current source transistors 196 and 198 comprise N-channel FETs. The differential pair 195, the bias transistor 191 and the constant current source 199, collectively comprise a well known topology for the differential amplifier 100. The input signal at the non-inverting input terminal 101 will be present at the output terminal 103 through a output stage 170. The output stage 170 comprises a P-channel current source transistor 172, and an N-channel current sink transistor 174, and provides the output terminal 103. Typically, capacitor 171 is used to provide stability for the output stage 107. In a voltage follower configuration, the inverting input terminal 111 is coupled to output signal 103 to provide a non-inverting unity gain for the differential amplifier 100.

Since the differential pair transistors 192 and 194 determine the current drive of the differential amplifier, they are sized to provide a substantially higher current drive capability than the transistors 196 and 198. It is well known in the art that the differential amplifier 100 provides smaller DC offset when identical current flows through transistors 194 and 192. However, under the same input signal conditions, a higher current flow through the non-inverting transistor 194 produces a positive DC offset voltage at the output terminal 103. Conversely, a higher current flow through the inverting amplifier produces a negative DC offset voltage at the output terminal 103. Accordingly, substantial current mirroring is provided by matching transistors 192, and 194 of the differential pair 195, and matching transistors 196 and 198 of constant current source 199. In the preferred embodiment of the invention, common centroid and interdigitization layout techniques are utilized for optimum matching of these transistors.

According to the invention, the current flow through the differential pair 195 may be adjusted (or refined) by controlling a plurality of parallel coupled stages 110, 120, 130, 140, 150, and 160. Each stage preferably comprises a N-channel transistor switch 182, and a N-channel FET 184. It is known that the current trough an activated stage is determined by the size (geometry) of its FET 184. In other words, the ratio of channel width (W) to channel length (L) (i.e., W/L) determines the current drive capacity of the transistors 184. In the preferred embodiment of the invention, each FET 184 has a predetermined drive capability. Preferably, however, each switch transistor 182 are identically sized, such that they do not limit the current through the transistor 184. The FETs 184 are selected to be substantially weaker and have substantially lower current drive capability than transistors 198 and 196, since they are used to "fine tune" the DC offset, and to minimize the additional area required to integrate them with the differential amplifier 100. As previously described, the gate and the drain of FETs 184 in stages 110, 120, and 130 are coupled to each other to provide mirrored current through differential pair transistors 192 and 194.

Control terminals 104, 105, 106, 107, 108, and 109 independently activate a respective stage by turning on the switch 182 in their respective stage. Stages 110, 120, and 130 control the current through the inverting transistor 192, while stages 140, 150, and 160 control the current through the non-inverting transistor 194. In theory, if the differential pair transistors 192 and 194, and constant current transistors 196 and 198 are ideally matched, applying a Vdd/2 signal at the non-inverting terminal 101 produces identical current flow through inverting and non-inverting stages. This results in a zero DC offset voltage. Since ideal matching is not physically realizable, however, the DC offset may be adjusted by selectively providing a control voltage on control terminals 104, 105, 106, 107, and 109 in order to activate one or more of the stages 110, 120, 130, 140, 150, and 160. Control voltage on terminals 104, 105, 106, 107, 108, and 109 may be provided by a microprocessor or a counter in response to the output DC offset voltage.

For example, when a negative offset voltage is present at the output terminal 103, a suitable control voltage at the terminal 107 will activate stage 140. Accordingly, transistor 184 of stage 140 will conduct a current proportional to its sizing (geometry), thereby increasing the current through non-inverting transistor 194. The increase of current through non-inverting transistor 194, decreases the negative offset voltage. If additional reduction in the offset voltage is required, the subsequent stages 150 and/or 160 may be activated. Conversely, if a positive DC offset voltage is present at the output terminal 103, stages 104, 105 and/or 106 may be activated to eliminate (or reduce) the offset voltage. In the preferred embodiment of the invention the FETs 184 of each stages are graded by their sizing, to provide more flexibility in adjusting the offset voltage. That is, the stage 140 has a stronger FET 184 than the stage 150, and the stage 150 has stronger FET 184 than the stage 160. In this way, activating each stage, depending on its size, provides a graded "fine tuning" of the current through the inverting and non-inverting transistors 192 and 194.

Those of ordinary skill in the art will appreciate that, the number of stages may be increased or decreased to affect the current flow through the inverting or non-inverting transistors 192 and 194. Accordingly, the current flow through only one of the inverting or non-inverting transistors 192 and 194 may be adjusted, if the matching of the transistors 192 and 194 is such that a positive or a negative offset voltage is present at the output terminal.

What is claimed is:

1. In an apparatus having an offset voltage being adjustable by adjusting current through a circuit, comprising:
    means for biasing said circuit;
    plurality of parallel transistor stages coupled to said circuit, each including:
        at least one transistor,
        means for increasing the current through said transistor stages when said transistor stages are activated, wherein geometry of said transistor determines the current increase;
        means for selectively activating a number of said transistor stages responsive to at least one control signal wherein the selected number of activated stages adjust the current through said circuit.

2. The apparatus of claim 1, wherein said circuit comprises a differential circuit.

3. The apparatus of claim 2, wherein said differential circuit comprises a differential amplifier.

4. The apparatus of claim 2, wherein said differential circuit comprises a comparator.

5. The apparatus of claim 2, wherein said differential circuit comprises an operational amplifier.

6. The apparatus of claim 1, wherein said transistor stages include FETs.

7. The apparatus of claim 1, wherein said transistors of said transistor stages have differential geometries.

8. A transistor circuit having adjustable offset voltage by adjusting current through said transistor circuit; comprising:
    means for biasing said circuit;
    a differential circuit;
    a plurality of parallel coupled transistor stages, coupled to said differential circuit, each including;
        at least one transistor,
        means for increasing the current through said transistor stages when said stages are activated, wherein geometry of said transistor determines the current increase;
        means for selectively activating a number of said transistor stages responsive to a least one control signal wherein the selected number of activated transistor stages adjust the current through said differential circuit.

9. The apparatus of claim 8, wherein said differential circuit includes FET transistors.

10. The apparatus of claim 8, wherein said transistor stages include FET transistors 11. The apparatus of claim 10, wherein said transistors of said transistor stages have different geometries.

* * * * *